United States Patent
Okawara et al.

(10) Patent No.: US 9,691,888 B1
(45) Date of Patent: Jun. 27, 2017

(54) IGBT

(71) Applicant: TOYOTA JIDOSHA KABUSHIKI KAISHA, Toyota-shi, Aichi-ken (JP)

(72) Inventors: Jun Okawara, Nisshin (JP); Masaru Senoo, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/290,434

(22) Filed: Oct. 11, 2016

(30) Foreign Application Priority Data

Dec. 8, 2015 (JP) ................. 2015-239624

(51) Int. Cl.
*H01L 29/74* (2006.01)
*H01L 29/739* (2006.01)
*H01L 29/10* (2006.01)
*H01L 29/06* (2006.01)

(52) U.S. Cl.
CPC ...... *H01L 29/7397* (2013.01); *H01L 29/0696* (2013.01); *H01L 29/1095* (2013.01)

(58) Field of Classification Search
CPC ............. H01L 29/7397; H01L 29/0696; H01L 29/1095; H01L 27/0921

USPC ........................................................ 257/139
See application file for complete search history.

(56) References Cited

U.S. PATENT DOCUMENTS 9,425,271 B2 * 8/2016 Saito ................... H01L 29/0696
9,437,700 B2 * 9/2016 Machida ............... H01L 29/456
2014/0054645 A1 2/2014 Saito et al.

FOREIGN PATENT DOCUMENTS

JP 2012-190938 A 10/2012

* cited by examiner

*Primary Examiner* — Tu-Tu Ho
(74) *Attorney, Agent, or Firm* — Oliff PLC

(57) ABSTRACT

An IGBT includes a rectangular trench including first to fourth trenches and a gate electrode arranged inside of the rectangular trench. An n-type emitter region includes a first emitter region being in contact with the first trench, and a second emitter region being in contact with the third trench. A body contact region includes a first body contact region being in contact with the second trench, and a second body contact region being in contact with the fourth trench. A surface body region is in contact with the trenches in ranges from connection portions to the emitter regions.

4 Claims, 9 Drawing Sheets

IGBT

CROSS-REFERENCE TO RELATED APPLICATION

This application claims priority to Japanese Patent Application No. 2015-239624 filed on Dec. 8, 2015, the entire contents of which are hereby incorporated by reference into the present application.

TECHNICAL FIELD

The technique disclosed herein relates to an IGBT (Insulated Gate Bipolar Transistor).

BACKGROUND ART

Japanese Patent Application Publication No. 2012-190938 discloses an IGBT provided with a rectangular trench. A gate electrode is disposed in the rectangular trench. An emitter region (n-type region), a body contact region ($p^+$-type region), a low-density body region ($p^-$-type region), and the like are provided in a rectangular region (semiconductor region) surrounded by the rectangular trench. The emitter region is in contact with an emitter electrode and the rectangular trench (that is, a gate insulating film). The body contact region is in contact with the emitter electrode. A part of the low-density body region is disposed at a surface portion of a semiconductor substrate, and is in contact with the emitter electrode and the rectangular trench at this location. Further, other parts of the low-density body region are disposed underneath the emitter region and the body contact region, and are in contact with the rectangular trench underneath the emitter region. Further, the semiconductor substrate includes a drift region and a collector region. The drift region is an n-type region disposed underneath the low-density body region. The collector region is a p-type region disposed underneath the drift region. The collector region is in contact with a collector electrode.

When this IGBT turns on, holes flow from the collector electrode to the emitter electrode, and electrons flow from the emitter electrode to the collector electrode. When the holes flow from the drift region into the low-density body region and the like in the rectangular region, the holes flow by avoiding the rectangular trench. Due to this, a hole density in the drift region in a vicinity of the rectangular trench becomes high. Especially in the drift region in a vicinity of connection portions (corner portions) of respective trenches within the rectangular trench, the hole density becomes extremely high since the holes avoiding two trenches flow in high concentration therethrough. Due to this, in the vicinities of the connection portions, a drift region resistance becomes extremely low. Thus, the electrons can flow in the vicinities of the connection portions at low loss. Due to this, this IGBT has a low on-voltage.

Further, Japanese Patent Application Publication No. 2012-190938 discloses a first configuration in which the emitter region is provided at a position being in contact with four trenches of the rectangular trench, and a second configuration in which the emitter region is provided at a position being in contact with two opposing trenches (which are hereinbelow referred to as a first trench and a third trench) of the rectangular trench, and no emitter region is provided at a position being in contact with the other two trenches (which are hereinbelow referred to as a second trench and a fourth trench). In the second configuration, a saturation current of the IGBT becomes smaller as compared to the first configuration. Thus, a short circuiting resistance of the IGBT (time during which the IGBT can withstand short circuiting under a state in which the saturation current is flowing in the IGBT) can be improved.

SUMMARY

In the second configuration of Japanese Patent Application Publication No. 2012-190938, the low-density body region is disposed over an entire range adjacent to the second and fourth trenches with which the emitter region is not in contact. Thus, when the IGBT turns on, a channel is generated over the entire range adjacent to the second and fourth trenches. As above, if the channel is generated over a wide range, the saturation current cannot be reduced sufficiently. That is, in the second configuration of Japanese Patent Application Publication No. 2012-190938, although the saturation current can be reduced as compared to the first configuration, it would be preferable to further reduce the saturation current. The second and fourth trenches may be shortened to reduce the range where the channel is to be generated. However, if the second and fourth trenches are shortened, a size of the rectangular trench becomes smaller, and it becomes difficult to form the rectangular trench. Further, if the rectangular trench becomes smaller, it would then become difficult to form the p-type and n-type regions within the rectangular region surrounded by the rectangular trench. Due to this, there is a limit to making the second and fourth trenches short. Thus, the present disclosure provides a new technique for reducing saturation current of an IGBT that includes a rectangular trench.

An IGBT disclosed herein comprises: a semiconductor substrate; an emitter electrode disposed on an upper surface of the semiconductor substrate; a collector electrode disposed on a lower surface of the semiconductor substrate; a rectangular trench extending in a rectangular shape in the upper surface; and a gate electrode disposed in the rectangular trench and insulated from the semiconductor substrate and the emitter electrode by an insulating film. The rectangular trench comprises first to fourth trenches. The first trench extends linearly in the upper surface. The second trench extends linearly in the upper surface in a direction different from the first trench and connected with the first trench at a first connection portion. The third trench extends linearly in the upper surface in a direction different from the second trench and connected with the second trench at a second connection portion. The fourth trench extends linearly in the upper surface in a direction different from the first and third trenches, is connected with the third trench at a third connection portion, and is connected with the first trench at a fourth connection portion. The gate electrode is arranged across insides of the first to fourth trenches. The semiconductor substrate comprises an n-type emitter region, a p-type body contact region, a p-type surface body region, a p-type separation body region, an n-type drift region, and a p-type collector region. The emitter region is disposed in a rectangular region surrounded by the rectangular trench and in contact with the emitter electrode. The body contact region is disposed in the rectangular region and in contact with the emitter electrode. The surface body region is disposed in the rectangular region, is in contact with the emitter electrode, and has a lower p-type impurity density than the body contact region. The separation body region is in contact with the emitter region, the body contact region, and the surface body region from underneath. The separation body region is in contact with the first to fourth trenches, and has a lower p-type impurity density than the body contact region. The n-type drift region is disposed on a lower side of the separation body region, separated from the emitter region by the separation body region, and in contact with lower ends of the first to fourth trenches. The collector region is disposed on a lower side of the drift region, separated from the separation body region by the drift region, and in contact with the collector electrode. The emitter region comprises a first emitter region being in contact with the first trench; and a second emitter region being in contact with the third trench. The body contact region comprises: a first body contact region being in contact with the second trench; and a second body contact region being in contact with the fourth trench. The surface body region comprises: a first surface body region being in contact with the first trench in a range from the first connection portion to the first emitter region; a second surface body region being in contact with the third trench in a range from the second connection portion to the second emitter region; a third surface body region being in contact with the third trench in a range from the third connection portion to the second emitter region; and a fourth surface body region being in contact with the first trench in a range from the fourth connection portion to the first emitter region.

Notably, the drift region may be in contact with the separation body region, or another region may be present between the drift region and the separation body region. Further, the first emitter region and the second emitter region may be continuous with each other, or may be separated from each other. Further, the first body contact region and the second body contact region may be continuous with each other, or may be separated from each other. Further, the first to fourth surface body regions may be continuous with each other, or may be separated from each other.

In this IGBT, the first body contact region is disposed at a position being in contact with the second trench, and the second body contact region is disposed at a position being in contact with the fourth trench in a surface portion (portion in a vicinity of the upper surface) of the semiconductor substrate. No channel is generated in the first body contact region and the second body contact region having the high p-type impurity density. Further, the separation body region having the low p-type impurity density is in contact with the second and fourth trenches underneath the first body contact region and the second body contact region. A channel is generated in the separation body region. However, in these portions, since an upper portion of the separation body region is covered by the first body contact region and the second body contact region, hardly any current flows in the channel of the separation body region in these portions. Due to this, according to this configuration, substantially no current flows in a periphery of the region where the first body contact region and the second body contact region are disposed. Due to this, according to this configuration, the saturation current of the IGBT can be lowered. Further, when the IGBT is to be turned on, a resistance becomes low in the drift region in vicinities of the respective connection portions of the rectangular trench (the first to fourth connection portions) by an effect of the rectangular trench. Further, in this configuration, the surface body regions (the first to fourth surface body regions) having the low p-type impurity density are provided in ranges from each of the connection portions of the rectangular trench to the corresponding one of the emitter regions. Due to this, a channel is generated in a range adjacent to each of the connection portions when the IGBT turns on. Thus, the current flows in the drift region in the vicinities of the respective connection portions with the low resistance. Due to this, an on-voltage of the IGBT becomes low. Accordingly, according to this configuration, the saturation current can be lowered while achieving an effect of on-voltage reduction by the rectangular trench.

DETAILED DESCRIPTION

Figure 1:
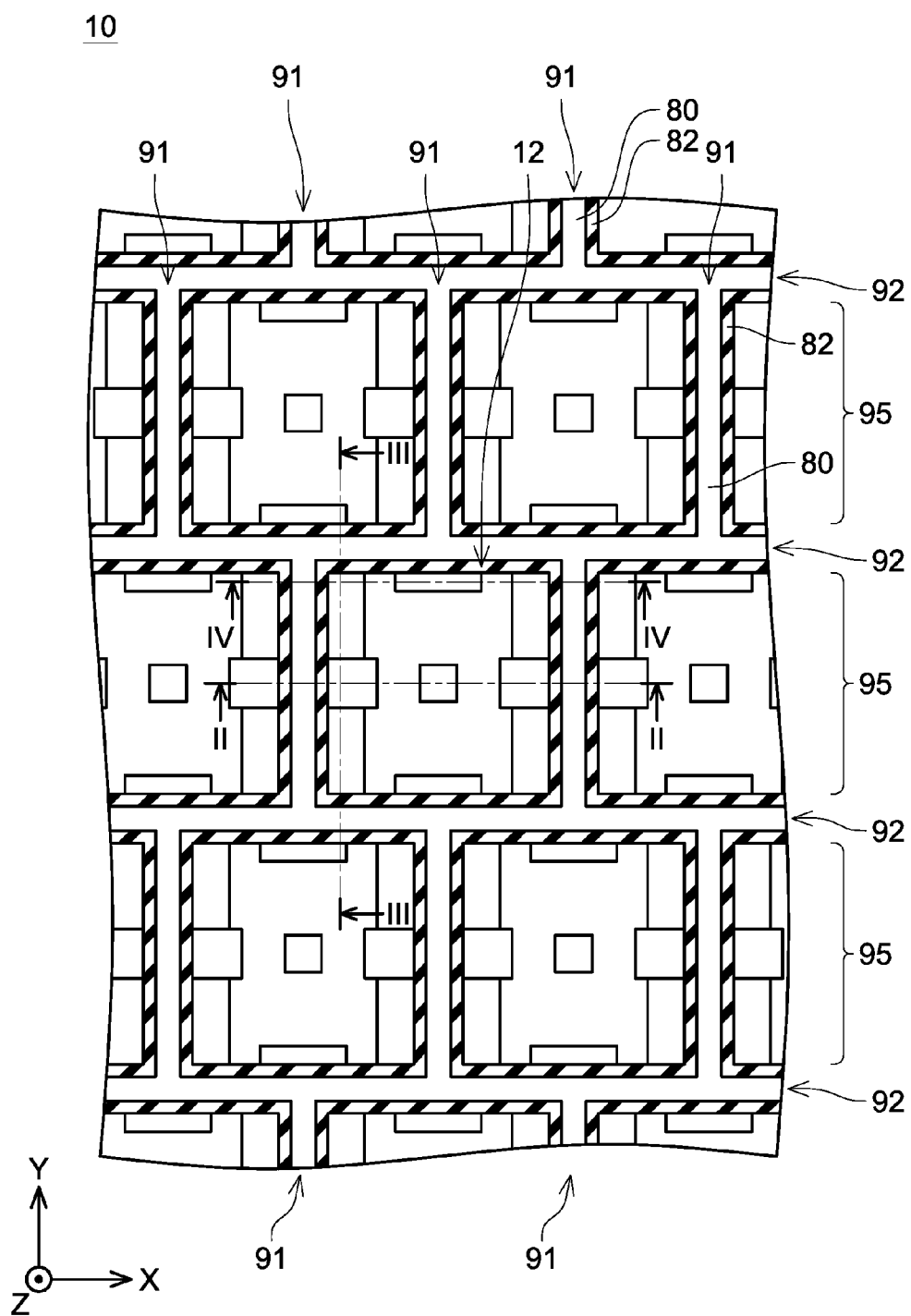
FIG. 1 is a plan view showing an upper surface of a semiconductor substrate.
Figure 2:
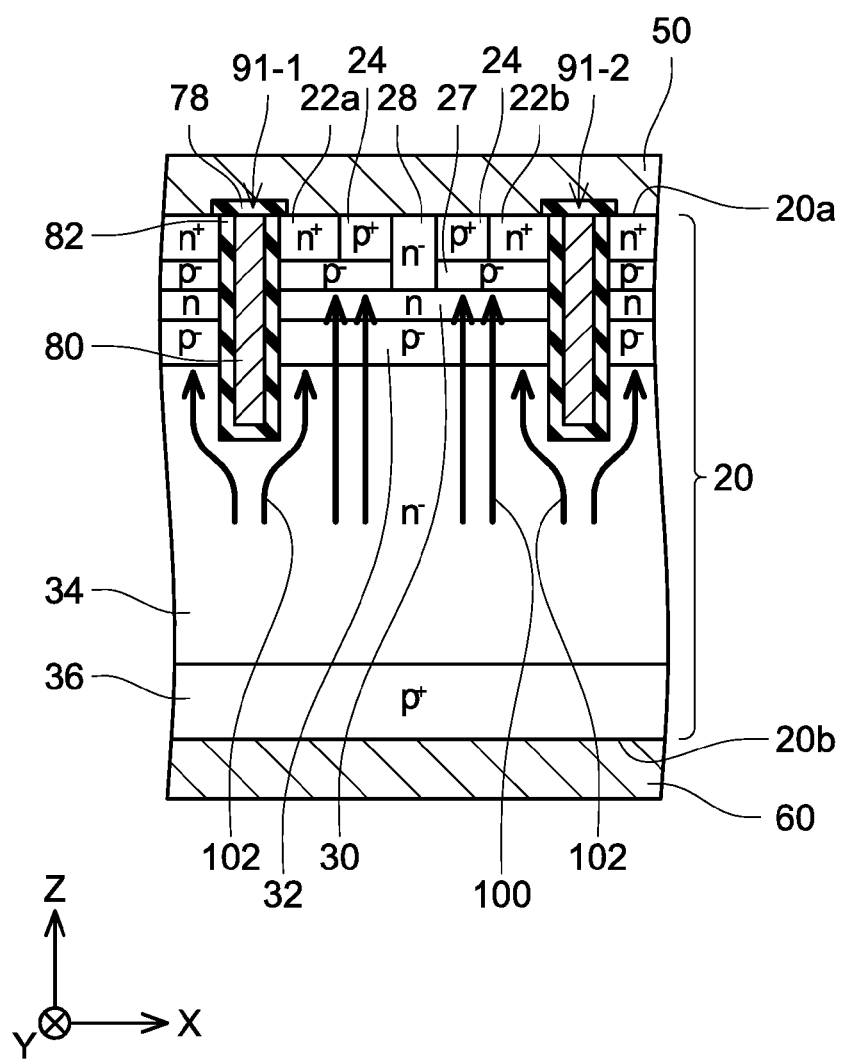
FIG. 2 is a vertical cross sectional view along a line II-II in FIG. 1.
Figure 3:
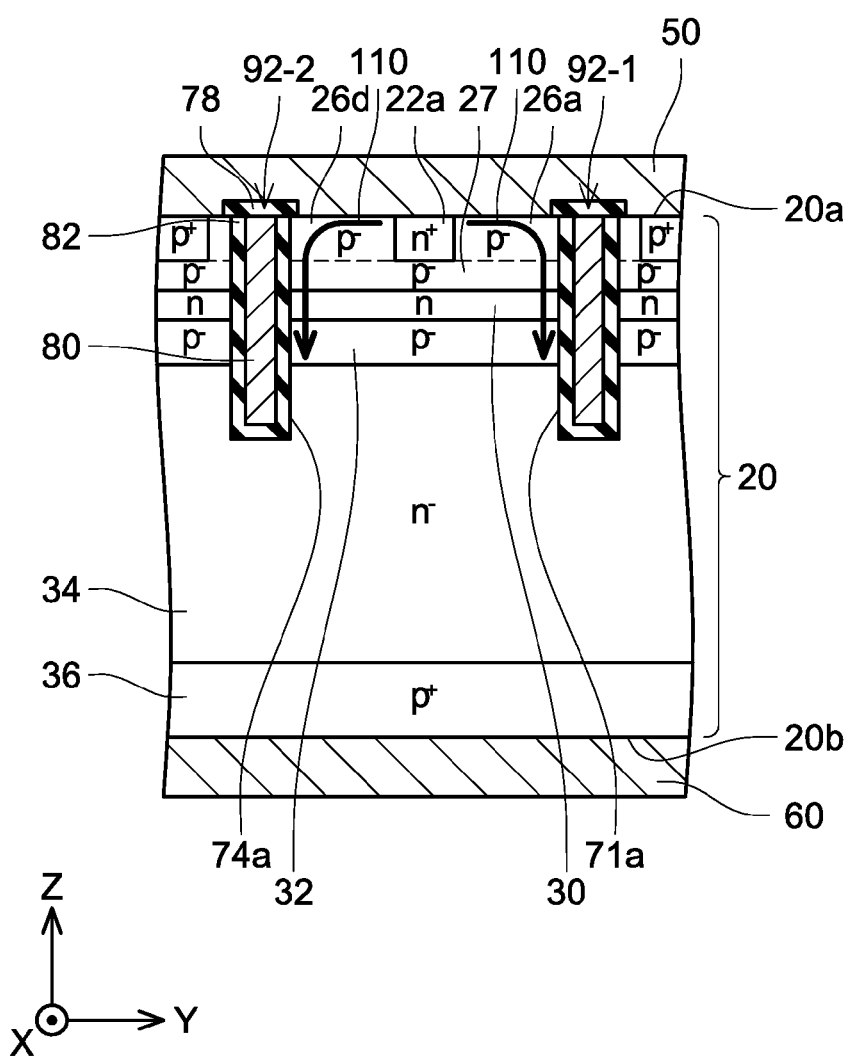
FIG. 3 is a vertical cross sectional view along a line II-III in FIG. 1.
Figure 4:
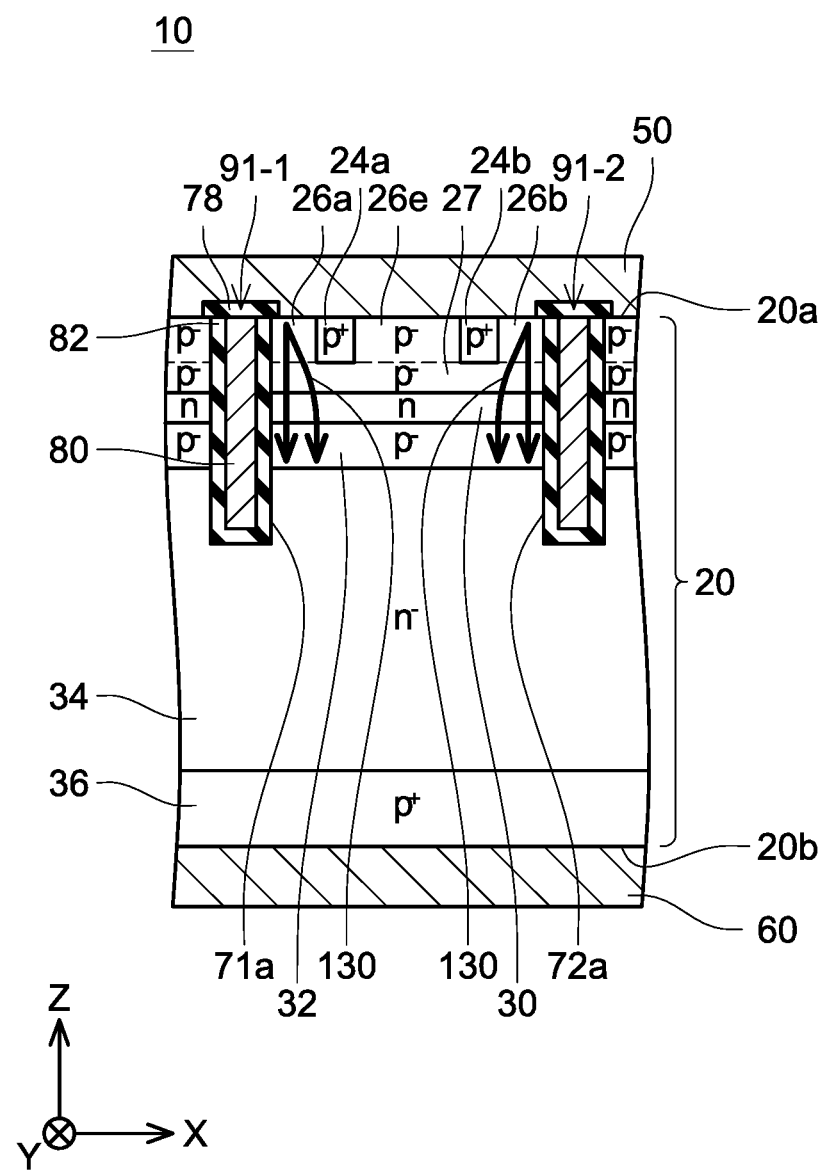
FIG. 4 is a vertical cross sectional view along a line IV-IV in FIG. 1.

FIGS. 1 to 4 show an IGBT 10 of an embodiment. As shown in FIGS. 2 to 4, the IGBT 10 comprises a semiconductor substrate 20, an emitter electrode 50, and a collector electrode 60. The emitter electrode 50 is disposed on an upper surface 20a of the semiconductor substrate 20. The collector electrode 60 is disposed on a lower surface 20b of the semiconductor substrate 20. Notably, in FIG. 1, depiction of structures above the upper surface 20a of the semiconductor substrate 20, such as the emitter electrode 50, are omitted. Further, in the description hereinbelow, one direction parallel to the upper surface 20a will be termed an x direction, a direction parallel to the upper surface 20a and perpendicularly intersecting the x direction will be termed a y direction, and a thickness direction of the semiconductor substrate 20 (that is, a direction perpendicularly intersecting the x direction and the y direction) will be termed a z direction.

A plurality of trenches 91 and a plurality of trenches 92 are provided in the upper surface 20a of the semiconductor substrate 20. As shown in FIGS. 2 to 4, each of the trenches 91 and 92 extends substantially vertical to the upper surface 20a of the semiconductor substrate 20 (that is, in the z direction). As shown in FIG. 1, each of the trenches 92 extends linearly in the x direction in a plan view of the upper surface 20a of the semiconductor substrate 20. The plural trenches 92 are arranged adjacently in the y direction with intervals in between. Each of the trenches 91 extends linearly in the y direction in the plan view of the upper surface 20a of the semiconductor substrate 20. The plural trenches 91 are disposed in each of ranges 95 intervened between adjacent two of the trenches 92. Both ends of each trench 91 are connected to the trenches 92 located on both sides of that trench 91. The respective trenches 91 are arranged so that each of their positions is offset in the x direction with respect to the trenches 91 adjacent in the y direction. Each trench 91 intersects with the corresponding trenches 92 at each of its end portions in a three-forked manner. The upper surface 20a of the semiconductor substrate 20 is partitioned into rectangular regions by the trenches 91 and 92. Hereinbelow, each of the rectangular semiconductor regions partitioned by the trenches 91 and 92 will be termed a rectangular region 12. Further, hereinbelow, a set of trenches 91 and 92 surrounding one rectangular region 12 will be termed a rectangular trench.

An inner surface of each rectangular trench (that is, its bottom surface and side surfaces) is covered by a gate insulating film 82. A gate electrode 80 is disposed in the rectangular trench. The gate electrode 80 faces the semiconductor substrate 20 via the gate insulating film 82. The gate electrode 80 is insulated from the semiconductor substrate 20 by the gate insulating film 82. The gate electrode 80 is arranged across insides of the trenches 91 and insides of the trenches 92. Due to this, in the plan view from above, a periphery of each rectangular region 12 is surrounded by the gate electrode 80. Further, as shown in FIGS. 2 to 4, an upper surface of the gate electrode 80 is covered by an interlayer insulating film 78. The emitter electrode 50 is disposed so as to cover the interlayer insulating film 78. The gate electrode 80 is insulated from the emitter electrode 50 by the interlayer insulating film 78.

Figure 5:
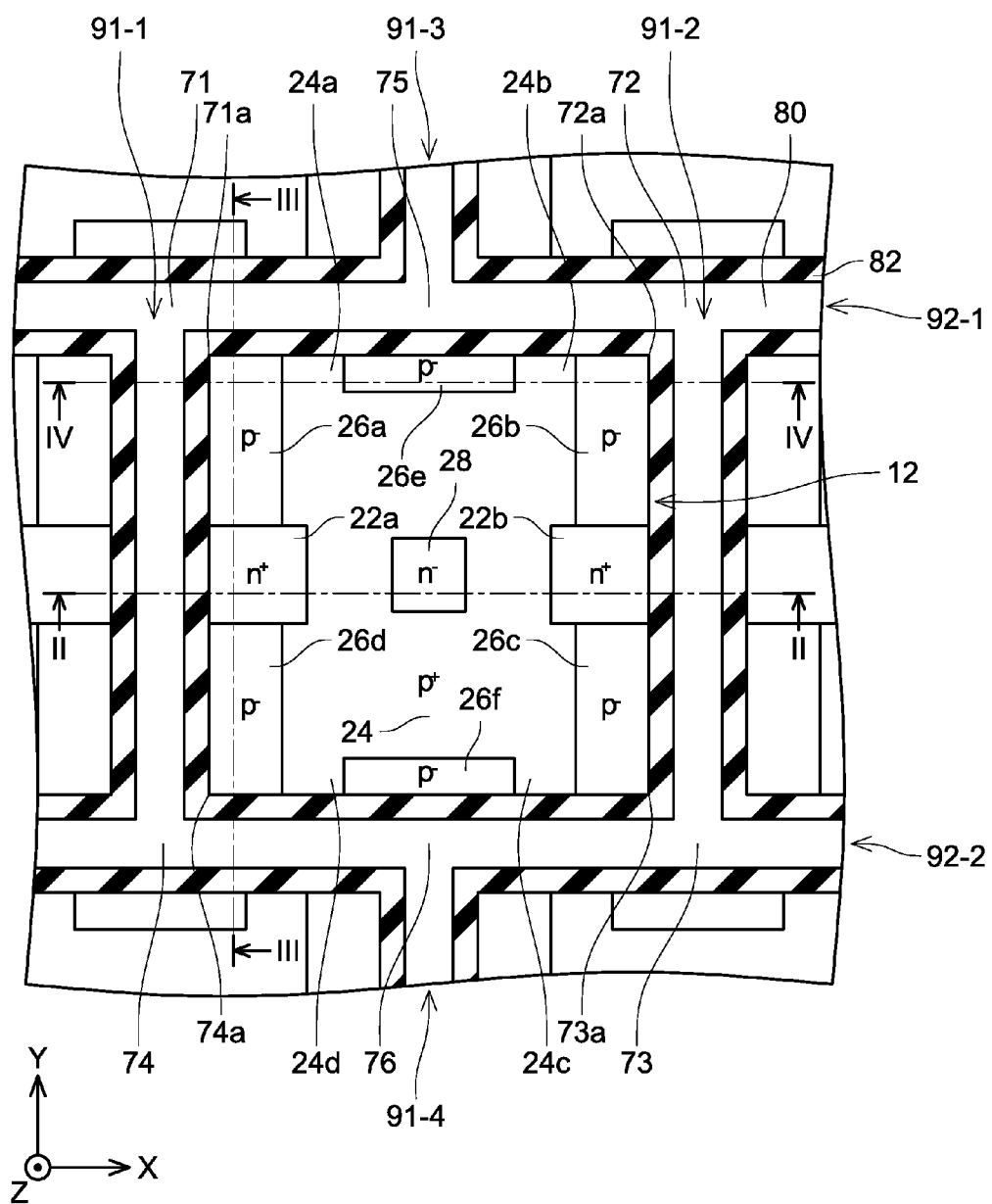
FIG. 5 is an enlarged plan view of a rectangular region.

Next, structures of the rectangular regions 12 will be described. Notably, the structure of each of the rectangular regions 12 is identical, so hereinbelow the structure of one rectangular region 12 will be described. FIG. 5 shows an enlarged plan view of one rectangular region 12. As shown in FIG. 5, the rectangular trench is constituted of two trenches 91 (trenches 91-1 and 91-2) and two trenches 92 (trenches 92-1 and 92-2). In other words, the rectangular region 12 is surrounded by the trenches 91-1, 91-2, 92-1, and 92-2. Hereinbelow, a portion where the trench 91-1 and the trench 92-1 are connected is termed a connection portion 71. Further, a portion where the trench 92-1 and the trench 91-2 are connected is termed a connection portion 72. Further, a portion where the trench 91-2 and the trench 92-2 are connected is termed a connection portion 73. Further, a portion where the trench 92-2 and the trench 91-1 are connected is termed a connection portion 74. Further, in the rectangular region 12, a portion adjacent to the connection portion 71 is termed a corner portion 71a, a portion adjacent to the connection portion 72 is termed a corner portion 72a, a portion adjacent to the connection portion 73 is termed a corner portion 73a, and a portion adjacent to the connection portion 74 is termed a corner portion 74a. Further, the trench 92-1 is connected with a trench 91-3, which constitutes the adjacent rectangular trenches, at a connection portion 75. The connection portion 75 is disposed at a center of one side of the rectangular trench. Further, the trench 92-2 is connected with a trench 91-4, which constitutes the adjacent rectangular trenches, at a connection portion 76. The connection portion 76 is disposed at a center of one side of the rectangular trench.

As shown in FIGS. 2 to 5, emitter regions 22, a body contact region 24, a surface body region 26, a separation body region 27, a pillar region 28, a barrier region 30, and a lower body region 32 are disposed inside each rectangular region 12.

The pillar region 28 is constituted of an n-type semiconductor with a low n-type impurity density. As shown in FIG. 2, the pillar region 28 is disposed in a range exposed on the upper surface 20a of the semiconductor substrate 20. The pillar region 28 is in a Schottky contact with the emitter electrode 50. As shown in FIG. 5, the pillar region 28 is disposed at a center of the rectangular region 12.

The body contact region 24 is constituted of a p-type semiconductor with a high p-type impurity density. As shown in FIGS. 2 and 4, the body contact region 24 is disposed in a range exposed on the upper surface 20a of the semiconductor substrate 20. As shown in FIG. 5, the body contact region 24 surrounds a periphery of the pillar region 28 on the upper surface 20a. The body contact region 24 is in an ohmic contact with the emitter electrode 50. The body contact region 24 comprises extended portions 24a to 24d. The extended portions 24a and 24b extend up to positions being in contact with the gate insulating film 82 within the trench 92-1. An interval is provided between the extended portion 24a and the extended portion 24b. The extended portions 24c and 24d extend up to positions being in contact with the gate insulating film 82 within the trench 92-2. An interval is provided between the extended portion 24c and the extended portion 24d. The body contact region 24 is not in contact with the gate insulating film 82 within the trenches 91-1 and 91-2. Notably, hereinbelow, being in contact with the gate insulating film within a trench is termed being in contact with the trench. That is, the body contact region 24 is in contact with the trenches 92-1 and 92-2, but is not in contact with the trenches 91-1 and 91-2.

The emitter regions 22 are constituted of an n-type semiconductor having a high n-type impurity density. As shown in FIG. 5, two emitter regions, namely an emitter region 22a and an emitter region 22b, are disposed in one rectangular region 12. As shown in FIG. 2, each emitter region 22 is disposed in a range exposed on the upper surface 20a of the semiconductor substrate 20. Each emitter region 22 is in ohmic contact with the emitter electrode 50. As shown in FIG. 5, the emitter region 22a is in contact with the trench 91-1. The emitter region 22a is in contact with the trench 91-1 at a position at a center of one side of the rectangular region 12. The emitter region 22a is not in contact with the trenches 92-1 and 92-2. The emitter region 22b is in contact with the trench 91-2. The emitter region 22b is in contact with the trench 91-2 at a position at a center of one side of the rectangular region 12. The emitter region 22b is not in contact with the trenches 92-1 and 92-2.

The surface body region 26 is constituted of a semiconductor having a lower p-type impurity density than the body contact region 24. As shown in FIGS. 3 and 4, the surface body region 26 is disposed in ranges exposed on the upper surface 20a of the semiconductor substrate 20. The surface body region 26 is in contact with the emitter electrode 50. As shown in FIG. 5, the surface body region 26 is separated into six regions 26a to 26f by the body contact region 24. The surface body region 26a is in contact with the trenches 91-1 and 92-1 at the corner portion 71a. The surface body region 26a is in contact with the trench 91-1 over an entire range from the corner portion 71a to the emitter region 22a. The surface body region 26b is in contact with the trenches 91-2 and 92-1 at the corner portion 72a. The surface body region 26b is in contact with the trench 91-2 over an entire range from the corner portion 72a to the emitter region 22b. The surface body region 26c is in contact with the trenches 91-2 and 92-2 at the corner portion 73a. The surface body region 26c is in contact with the trench 91-2 over an entire range from the corner portion 73a to the emitter region 22b. The surface body region 26d is in contact with the trenches 91-1 and 92-2 at the corner portion 74a. The surface body region 26d is in contact with the trench 91-1 over an entire range from the corner portion 74a to the emitter region 22a. The surface body region 26e is in contact with the trench 92-1 at a position between the extended portion 24a and the extended portion 24b of the body contact region 24. The surface body region 26e is in contact with the trench 92-1 at the connection portion 75. The surface body region 26f is in contact with the trench 92-2 at a position between the extended portion 24c and the extended portion 24d of the body contact region 24. The surface body region 26f is in contact with the trench 92-2 at the connection portion 76.

The separation body region 27 is constituted of a p-type semiconductor having a lower p-type impurity density than the body contact region 24. The p-type impurity densities of the surface body region 26 and the separation body region 27 are substantially identical. As shown in FIGS. 2 to 4, the separation body region 27 is disposed underneath the emitter regions 22, the body contact region 24, and the surface body region 26. The separation body region 27 is in contact with the emitter regions 22, the body contact region 24, and the surface body region 26 from underneath. The separation body region 27 expands over an entire region in lateral directions (x direction and y direction) of the rectangular region 12 except for a lower portion of the pillar region 28. The pillar region 28 extends downward from the upper surface 20a and penetrates the separation body region 27. The separation body region 27 is in contact with the trenches 91-1, 91-2, 92-1, and 92-2 underneath the emitter regions 22, the body contact region 24, and the surface body region 26.

The barrier region 30 is constituted of an n-type semiconductor having a lower n-type impurity density than the emitter regions 22. As shown in FIGS. 2 to 4, the barrier region 30 is disposed underneath the separation body region 27 and the pillar region 28. The barrier region 30 is in contact with the separation body region 27 and the pillar region 28 from underneath. The barrier region 30 expands over the entire region in the lateral directions (x direction and y direction) of the rectangular region 12. The barrier region 30 is in contact with the trenches 91-1, 91-2, 92-1, and 92-2 underneath the separation body region 27. The barrier region 30 is separated from the emitter regions 22 by the separation body region 27.

The lower body region 32 is constituted of a p-type semiconductor having a lower p-type impurity density than the body contact region 24. As shown in FIGS. 2 to 4, the lower body region 32 is disposed underneath the barrier region 30. The lower body region 32 is in contact with the barrier region 30 from underneath. The lower body region 32 expands over the entire region in the lateral directions (x direction and y direction) of the rectangular region 12. The lower body region 32 is in contact with the trenches 91-1, 91-2, 92-1, and 92-2 underneath the barrier region 30. The lower body region 32 is separated from the separation body region 27 by the barrier region 30.

The semiconductor substrate 20 comprises a drift region 34 and a collector region 36. The drift region 34 and the collector region 36 are disposed under the plurality of rectangular regions 12.

The drift region 34 is constituted of an n-type semiconductor having a lower n-type impurity density than the barrier region 30 and the pillar region 28. As shown in FIGS. 2 to 4, the drift region 34 is disposed underneath the lower body region 32. The drift region 34 is in contact with the lower body region 32 from underneath. The drift region 34 extends in the lateral directions over a range under the plurality of rectangular regions 12. The drift region 34 expands over an entire region of the semiconductor substrate 20 in the lateral directions (x direction and y direction). The drift region 34 is in contact with lower ends of the trenches 91 and 92. The drift region 34 is separated from the barrier region 30 by the lower body region 32.

The collector region 36 is constituted of a p-type semiconductor having a higher p-type impurity density than the separation body region 27 and the lower body region 32. As shown in FIGS. 2 to 4, the collector region 36 is disposed underneath the drift region 34. The collector region 36 is in contact with the drift region 34 from underneath. The collector region 36 is separated from the lower body region 32 by the drift region 34. The collector region 36 is disposed in a range exposed on the lower surface 20b of the semiconductor substrate 20. The collector region 36 is in ohmic contact with the collector electrode 60.

Next, an operation of the IGBT 10 will be described. When the IGBT 10 is used, a voltage with which the collector electrode 60 is charged positive is applied between the collector electrode 60 and the emitter electrode 50. When a voltage that is equal to or greater than a threshold is applied to the gate electrode 80, the surface body region 26, the separation body region 27, and the lower body region 32 within ranges being in contact with the gate insulating film 82 are inverted to the n-type, and channels are generated therein. For example, in the cross section shown in FIG. 2, the channels are generated in the separation body region 27 and the lower body region 32 within the ranges being in contact with the gate insulating film 82 of the trenches 91. Further, the cross section of FIG. 3 is a cross section of the semiconductor layer in a vicinity of the gate insulating film 82 in the trench 91-1, as indicated by a line III-III in FIGS. 1 and 5. Thus, the channels are generated over entireties of the surface body region 26, the separation body region 27, and the lower body region 32 that are shown in the cross section of FIG. 3. Further, the cross section of FIG. 4 is a cross section of the semiconductor layer in a vicinity of the gate insulating film 82 in the trench 92-1, as indicated by a line IV-IV in FIGS. 1 and 5. Thus, the channels are generated over entireties of the surface body region 26, the separation body region 27, and the lower body region 32 that are shown in the cross section of FIG. 4. When the channels are generated, electrons flow from the emitter electrode 50 into the drift region 34 through the emitter regions 22 and the channels. At the same time, holes flow from the collector electrode 60 into the drift region 34 through the collector region 36. At this occasion, an electric resistance of the drift region 34 drops by a conductivity modulation phenomenon. The electrons that had flown into the drift region 34 further flows to the collector electrode 60 by passing through the drift region 34 and the collector region 36. As above, a current flows in the IGBT due to the electrons flowing into the collector electrode 60 from the emitter electrode 50.

Further, the holes that had flown into the drift region 34 pass through the lower body region 32 and the barrier region 30, and flow into the separation body region 27 as shown by arrows 100 in FIG. 2, and thereafter flow from the body contact region 24 to the emitter electrode 50. At this occasion, the barrier region 30 becomes a barrier that hinders the flow of the holes. Thus, the holes are suppressed from flowing into the separation body region 27. Due to this, a hole density in the drift region 34 is increased, and hence the electric resistance of the drift region 34 is further reduced.

Further, as shown by arrows 102 in FIG. 2, the holes in the drift region 34 below the trenches 91 flow so as to avoid the trenches 91. Similarly, the holes in the drift region 34 below the trenches 92 flow so as to avoid the trenches 92. Due to this, the holes flowing while avoiding the trenches 91 and the holes flowing while avoiding the trenches 92 are accumulated in the drift region 34 located at the corner portions 71a to 74a of the rectangular region 12, thus the hole density thereof becomes extremely high. Due to this, the electric resistance of the drift region 34 becomes extremely low at the corner portions 71a to 74a. As shown in FIGS. 3 and 5, since the surface body region 26 is in contact with the trenches 91 over the entire ranges between the emitter regions 22 and the corner portions 71a to 74a, the channels are generated over the entire ranges from the emitter regions 22 to the corner portions 71a to 74a. Thus, as shown by arrows 110 in FIG. 3, the electrons can flow from the emitter regions 22 to the drift region 34 of the corner portions 71a to 74a. Thus, the electrons can flow through the regions with extremely low electric resistance. Due to this, an on-voltage of the IGBT can be reduced.

Figure 6:
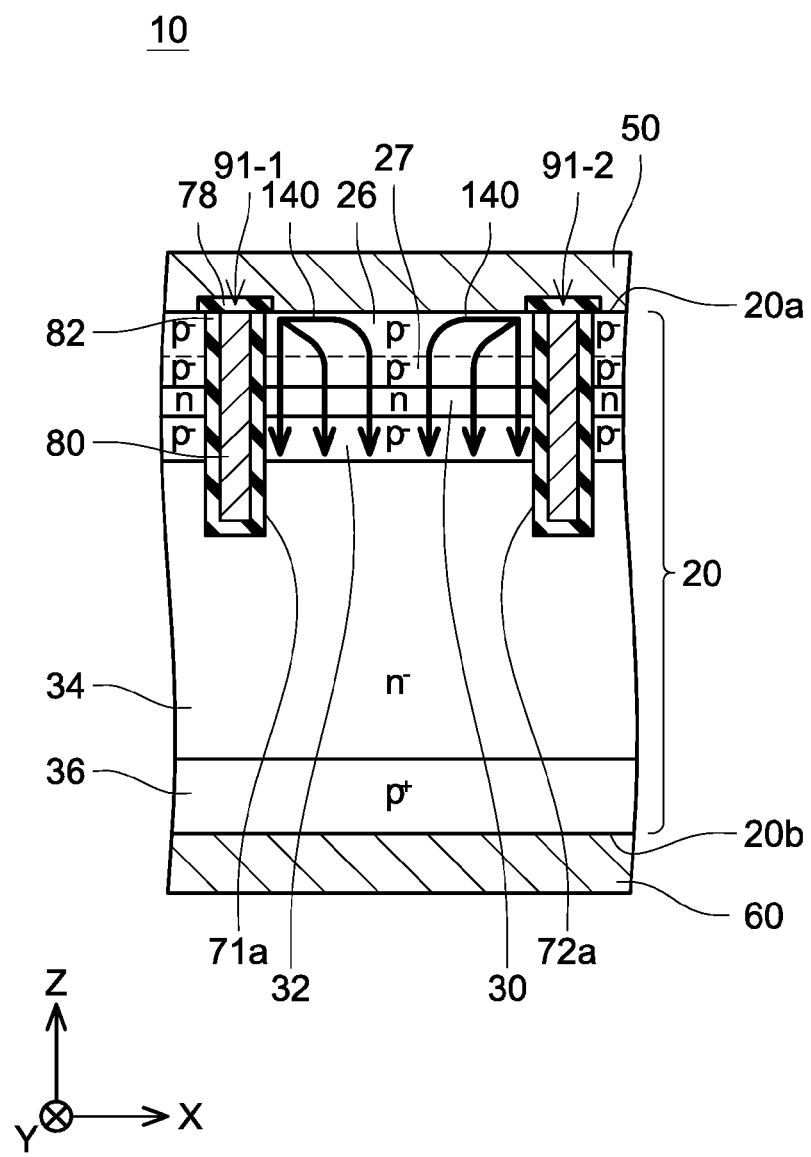
FIG. 6 is a vertical cross sectional view of an IGBT of a comparative example corresponding to FIG. 4.

Further, as aforementioned, in the cross section shown in FIG. 4, the channels are generated over entireties of the surface body region 26, the separation body region 27, and the lower body region 32. If, as shown in FIG. 6, the extended portions 24a and 24b of the body contact region 24 do not exist (that is, if the body contact region 24 is not in contact with the trench 92-1), electrons flow over almost entire regions of the channels that are in contact with the trench 92-1 from the corner portions 71a and 72a as shown by arrows 140. Contrary to this, when the extended portions 24a and 24b are provided as in FIG. 4, the electrons do not flow though the extended portions 24a and 24b. This is because the p-type impurity density of the extended portions 24a and 24b is high, and thus no channel is generated in the extended portions 24a and 24b. Further, the electrons also do not flow through the surface body region 26e that is intervened between the extended portions 24a and 24b. As a result, as shown by arrows 130 in FIG. 4, the electrons flow in vicinities of the corner portions 71a and 72a but hardly any electrons flow in the extended portions 24a, 24b, the surface body region 26e, and portions under these regions. Accordingly, due to the extended portions 24a and 24b being in contact with the trench 92-1, the electrons can be suppressed from flowing in the ranges adjacent to the trench 92-1. Further, due to the same reason, hardly any electrons flow in the extended portions 24c, 24d and the surface body region 26f, as well as portions under these regions. Due to this, the electrons are suppressed from flowing in the ranges adjacent to the trench 92-2.

As described above, in this IGBT 10, the electrons are suppressed from flowing in the semiconductor regions adjacent to the trenches 92-1 and 92-2 by the extended portions 24a to 24d of the body contact region 24. That is, a part of a range adjacent to the trench 92 is prohibited from functioning as a current passage. Due to this, a substantial channel density is small. Thus, a saturation current of the IGBT 10 is small. As above, according to the technique of the embodiment, the saturation current of the IGBT can be reduced without decreasing a size of the rectangular regions 12. The reduction in the saturation current allows an increase in a short-circuiting resistance of the IGBT 10. Further, since the size of the rectangular regions 12 is not reduced, the IGBT 10 can be manufactured without using a special microfabrication and by using a process with about the same degree of accuracy as the conventional technique.

Further, according to the configuration of the aforementioned embodiment, the reduction in the saturation current further allows a reduction in a variation of the saturation current.

Further, the connection portions 71 to 76 of the trenches 91 and 92 have a trench depth that is deeper than other portions of the trenches. This is due to an etching rate for the connection portions 71 to 76 being accelerated due to a micro loading effect upon forming the trenches 91 and 92 by using anisotropic dry etching. Further, due to the occurrence of the micro loading effect, the trench depth of the connection portions 71 to 76 is not stable. With respect to this, the IGBT 10 of the embodiment has the surface body regions 26e and 26f at positions that are not at the corner portions and adjacent to the connection portions 75 and 76. As aforementioned, when the IGBT 10 turns on, hardly any electrons flow in the surface body regions 26e and 26f. Thus, the variation in the trench depth of the connection portions 75 and 76 hardly affects the characteristics of the IGBT 10. Due to this, according to this configuration, a variation in the characteristics of the IGBT 10 can be suppressed.

Figure 7:
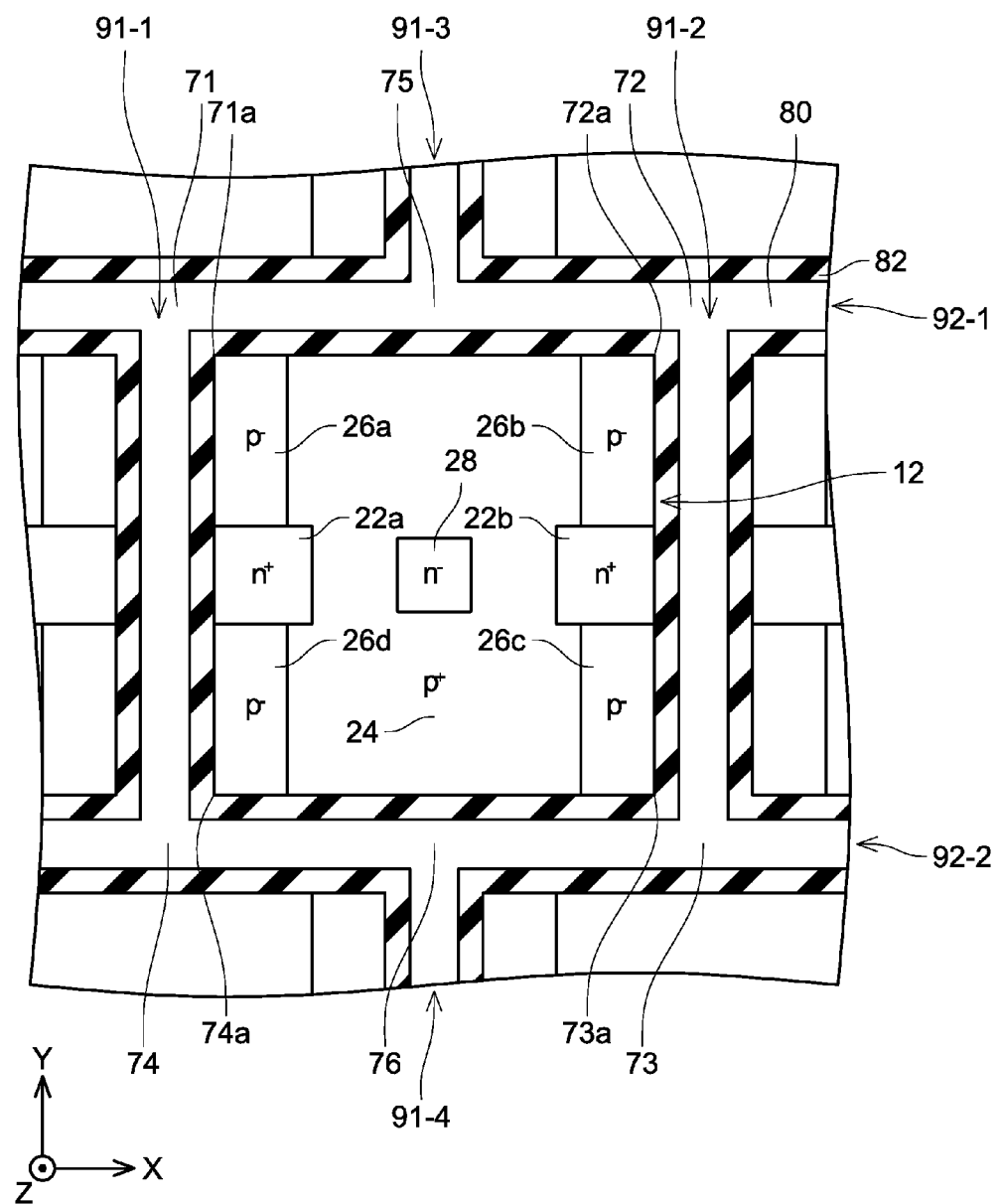
FIG. 7 is an enlarged plan view of an IGBT of a first variant corresponding to FIG. 5.

Notably, the aforementioned IGBT 10 was provided with the surface body regions 26e and 26f. However, as shown in FIG. 7, the body contact region 24 may be in contact with the trenches 92-1 and 92-2 over entireties of positions corresponding to the surface body regions 26e and 26f. According to such a configuration as well, the electrons can be suppressed from flowing in the ranges adjacent to the trenches 92-1 and 92-2.

Figure 8:
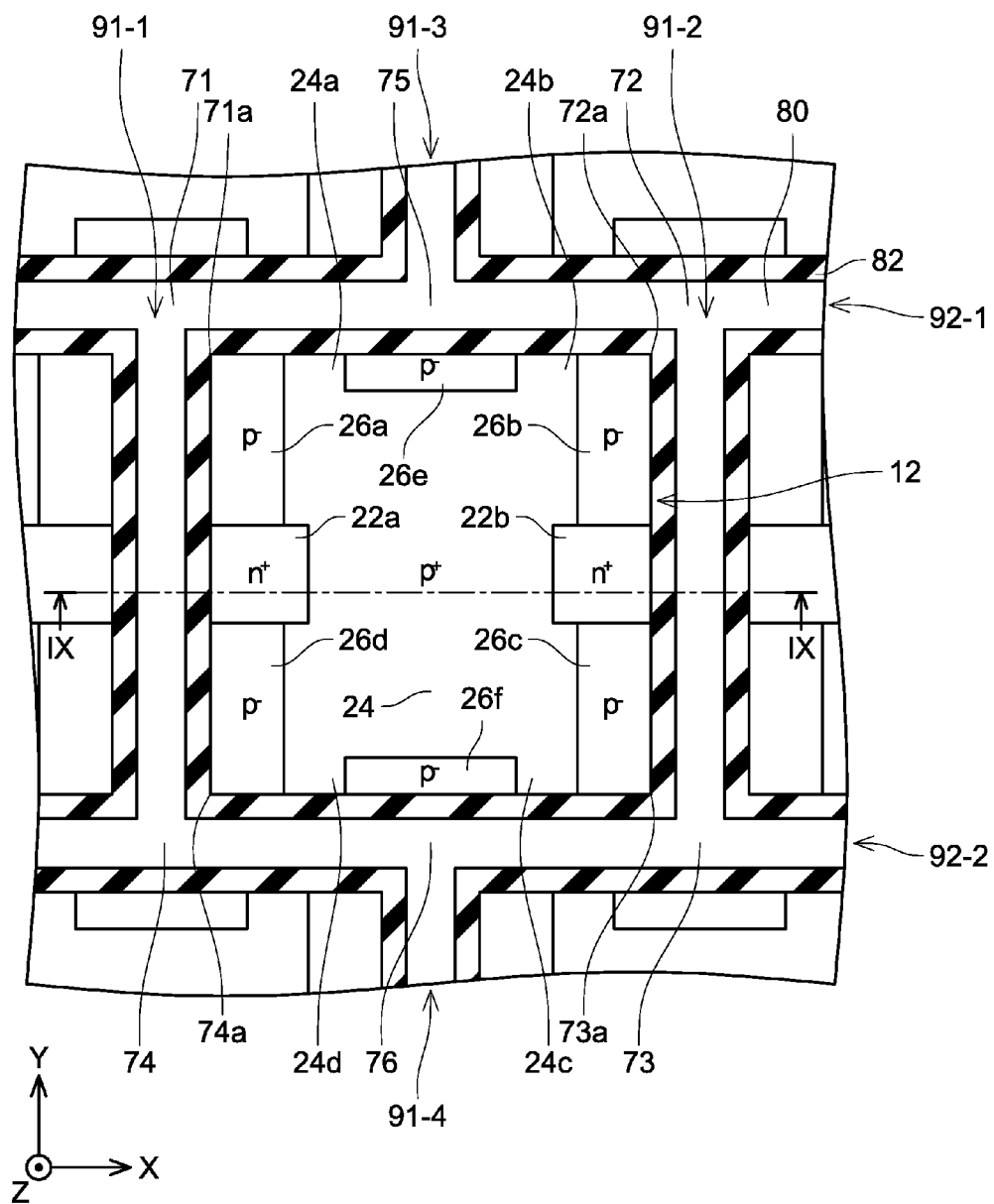
FIG. 8 is an enlarged plan view of an IGBT of a second variant corresponding to FIG. 5.
Figure 9:
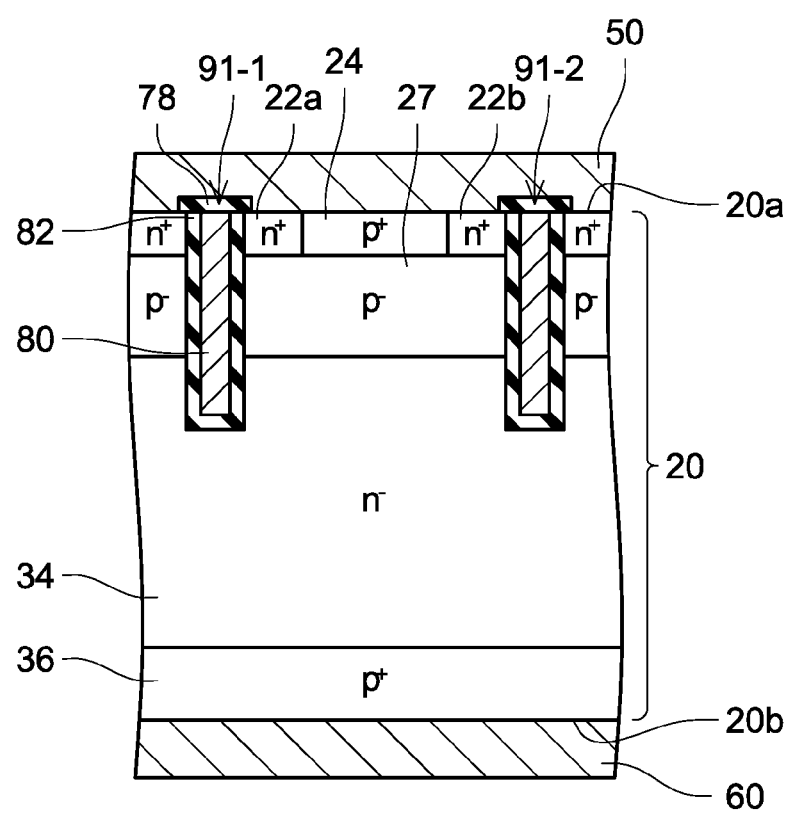
FIG. 9 is a vertical cross sectional view of the IGBT of the second variant corresponding to FIG. 2.

Further, in the aforementioned embodiment, the IGBT 10 was provided with the barrier region 30 and the pillar region 28, however, as shown in FIGS. 8 and 9, the IGBT may not be provided with the barrier region 30 and the pillar region 28. In this case, the separation body region 27 is in direct contact with the drift region 34. According to such a configuration as well, the IGBT can operate. Further, a configuration may be employed in which the barrier region 30 is provided but the pillar region 28 is not.

Further, in the aforementioned embodiment, the portions of the body contact region 24 that are in contact with the trench 92-1 (that is, the extended portions 24a and 24b) were connected with the portions of the body contact region 24 that are in contact with the trench 92-2 (that is, the extended portions 24c and 24d). However, these portions may be separated from each other. Further, in the aforementioned embodiment, the emitter region 22a was separated from the emitter region 22b. However, the emitter region 22a may be connected to the emitter region 22b. Further, in the aforementioned embodiment, the surface body regions 26a to 26d were separated from each other. However, some of or all of the surface body regions 26a to 26d may be connected to each other.

Relationships between constituent features of the embodiment and constituent features of the claims will be described hereinbelow. The trench 91-1 in the embodiment is an example of a first trench in the claims. The trench 92-1 in the embodiment is an example of a second trench in the claims. The trench 91-2 in the embodiment is an example of a third trench in the claims. The trench 92-2 in the embodiment is an example of a fourth trench in the claims. The trench 91-3 in the embodiment is an example of a fifth trench in the claims. The connection portion 71 in the embodiment is an example of a first connection portion in the claims. The connection portion 72 in the embodiment is an example of a second connection portion in the claims. The connection portion 73 in the embodiment is an example of a third connection portion in the claims. The connection portion 74 in the embodiment is an example of a fourth connection portion in the claims. The emitter region 22a in the embodiment is an example of a first emitter region in the claims. The emitter region 22b in the embodiment is an example of a second emitter region in the claims. The extended portions 24a and 24b in the embodiment are examples of a first body contact region in the claims. The extended portions 24c and 24d in the embodiment are examples of a second body contact region in the claims. The surface body region 26a in the embodiment is an example of a first surface body region in the claims. The surface body region 26b in the embodiment is an example of a second surface body region in the claims. The surface body region 26c in the embodiment is an example of a third surface body region in the claims. The surface body region 26d in the embodiment is an example of a fourth surface body region in the claims.

Some of the technical features disclosed herein will be listed below. Notably, the respective technical features hereinbelow are each independently useful.

In an IGBT disclosed herein as an example, the semiconductor substrate may comprise an n-type barrier region and a p-type lower body region. The barrier region may be disposed in the rectangular region and in contact with the separation body region from underneath. The lower body region may be disposed in the rectangular region and in contact with the barrier region from underneath. The drift region may be in contact with the lower body region from underneath.

According to this configuration, when the IGBT is on, the holes are suppressed from flowing from the drift region to the separation body region due to a pn junction at an interface between the barrier region and the lower body region. Due to this, the hole density in the drift region becomes high, and the on-voltage of the IGBT becomes low.

In an IGBT disclosed herein as an example, the separation body region may be in contact with the drift region.

According to this configuration, the configuration of the IGBT can be simplified.

An IGBT disclosed herein as an example may further comprise a fifth trench disposed in the upper surface on an outside of the rectangular region and connected to the second trench. The first body contact region may be in contact with the second trench on both sides of a connection portion between the second trench and the fifth trench.

At the connection portion between the second trench and the fifth trench, the trench thereof becomes deeper as compared to portions other than the connection portion. In its manufacturing step, trench depth control for the connection portions is difficult, and the variation in the trench depth at the connection portions is large. When a current flows through positions adjacent to such connection portions, a characteristic of a passage through which the current flows is not stabilized, and a variation is generated among IGBTs in their characteristics. Contrary to this, when the first body contact region is disposed to be in contact with the second trench on both sides of the connection portion between the second trench and the fifth trench, hardly any current flows through the positions adjacent to this connection portion. Due to this, the characteristic variation of the IGBT can be suppressed.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. An IGBT comprising:
   a semiconductor substrate;
   an emitter electrode disposed on an upper surface of the semiconductor substrate;
   a collector electrode disposed on a lower surface of the semiconductor substrate;
   a rectangular trench extending in a rectangular shape in the upper surface; and
   a gate electrode disposed in the rectangular trench and insulated from the semiconductor substrate and the emitter electrode by an insulating film,
   wherein
   the rectangular trench comprises:
   a first trench extending linearly in the upper surface;
   a second trench extending linearly in the upper surface in a direction different from the first trench and connected with the first trench at a first connection portion;
   a third trench extending linearly in the upper surface in a direction different from the second trench and connected with the second trench at a second connection portion; and
   a fourth trench extending linearly in the upper surface in a direction different from the first and third trenches, connected with the third trench at a third connection portion, and connected with the first trench at a fourth connection portion,
   wherein the gate electrode is arranged across insides of the first to fourth trenches,
   the semiconductor substrate comprises:
   an n-type emitter region disposed in a rectangular region surrounded by the rectangular trench and being in contact with the emitter electrode;
   a p-type body contact region disposed in the rectangular region and being in contact with the emitter electrode;
   a p-type surface body region disposed in the rectangular region, being in contact with the emitter electrode, and having a lower p-type impurity density than the body contact region;
   a p-type separation body region being in contact with the emitter region, the body contact region, and the surface body region from underneath, being in contact with the first to fourth trenches, and having a lower p-type impurity density than the body contact region;
   an n-type drift region disposed on a lower side of the separation body region, separated from the emitter region by the separation body region, and being in contact with lower ends of the first to fourth trenches; and
   a p-type collector region disposed on a lower side of the drift region, separated from the separation body region by the drift region, and being in contact with the collector electrode,
   the emitter region comprises:
   a first emitter region being in contact with the first trench; and
   a second emitter region being in contact with the third trench,
   the body contact region comprises:
   a first body contact region being in contact with the second trench; and
   a second body contact region being in contact with the fourth trench, the surface body region comprises:
   a first surface body region being in contact with the first trench in a range from the first connection portion to the first emitter region;
   a second surface body region being in contact with the third trench in a range from the second connection portion to the second emitter region;
   a third surface body region being in contact with the third trench in a range from the third connection portion to the second emitter region; and
   a fourth surface body region being in contact with the first trench in a range from the fourth connection portion to the first emitter region.

2. The IGBT of claim 1, wherein
the semiconductor substrate further comprises:
an n-type barrier region disposed in the rectangular region and being in contact with the separation body region from underneath; and
a p-type lower body region disposed in the rectangular region and being in contact with the barrier region from underneath,
wherein the drift region is in contact with the lower body region from underneath.

3. The IGBT of claim 1, wherein the separation body region is in contact with the drift region.

4. The IGBT of claim 1, further comprising a fifth trench disposed in the upper surface on an outside of the rectangular region and connected to the second trench,
wherein the first body contact region is in contact with the second trench on both sides of a connection portion between the second trench and the fifth trench.

* * * * *